United States Patent
De Bosscher et al.

(10) Patent No.: US 11,549,174 B2
(45) Date of Patent: Jan. 10, 2023

(54) SPRAYED LITHIUM COBALT OXIDE TARGETS

(71) Applicant: SOLERAS ADVANCED COATINGS BV, Deinze (BE)

(72) Inventors: Wilmert De Bosscher, Drongen (BE); Jörg Oberste Berghaus, Verdun (CA)

(73) Assignee: SOLERAS ADVANCED COATINGS BV, Deinze (BE)

(*) Notice: Subject to any disclaimer, the term of this patent is extended or adjusted under 35 U.S.C. 154(b) by 206 days.

(21) Appl. No.: 16/954,934

(22) PCT Filed: Dec. 11, 2018

(86) PCT No.: PCT/EP2018/084379
§ 371 (c)(1),
(2) Date: Jun. 17, 2020

(87) PCT Pub. No.: WO2019/121170
PCT Pub. Date: Jun. 27, 2019

(65) Prior Publication Data
US 2020/0377994 A1  Dec. 3, 2020

(30) Foreign Application Priority Data
Dec. 18, 2017 (BE) .................. 2017/5957

(51) Int. Cl.
*C23C 14/34* (2006.01)
*C23C 4/11* (2016.01)
(Continued)

(52) U.S. Cl.
CPC .......... *C23C 14/3414* (2013.01); *C01G 51/42* (2013.01); *C23C 4/11* (2016.01);
(Continued)

(58) Field of Classification Search
None
See application file for complete search history.

(56) References Cited

U.S. PATENT DOCUMENTS 8,062,486 B2   11/2011  Nagase et al.
9,334,557 B2    5/2016  Neudecker et al.
(Continued)

FOREIGN PATENT DOCUMENTS

CN   101273431 A   9/2008
CN   101495666 A   7/2009
(Continued)

OTHER PUBLICATIONS

Zhu et al., LiCoO2 cathode thin film fabricated by RF sputtering for lithium ion microbatteries, 2010, Surface and Coatings Tech, 204, 1710 (Year: 2010).*
(Continued)

*Primary Examiner* — Daniel S Gatewood
(74) *Attorney, Agent, or Firm* — Workman Nydegger

(57) ABSTRACT

A sputtering target comprising a top coat including a composition of lithium cobalt oxide $Li_yCo_zO_x$. x is smaller than or equal to y+z, and the lithium cobalt oxide has an X-Ray diffraction pattern with a peak P2 at 44°±0.2° 2-theta. The X-Ray diffraction pattern is measured with an X-Ray diffractometer with CuKα1 radiation.

15 Claims, 6 Drawing Sheets

(51) Int. Cl.
  *C01G 51/00* (2006.01)
  *C23C 14/08* (2006.01)
  *H01J 37/34* (2006.01)
  *H01M 4/04* (2006.01)
  *H01M 4/525* (2010.01)
  *H01M 10/0525* (2010.01)
  *H01M 4/02* (2006.01)

(52) U.S. Cl.
  CPC ........ *C23C 14/085* (2013.01); *H01J 37/3426* (2013.01); *H01M 4/0426* (2013.01); *C01P 2002/32* (2013.01); *C01P 2002/72* (2013.01); *C01P 2002/74* (2013.01); *C01P 2002/76* (2013.01); *C01P 2002/82* (2013.01); *H01M 4/525* (2013.01); *H01M 10/0525* (2013.01); *H01M 2004/028* (2013.01)

(56) References Cited

U.S. PATENT DOCUMENTS

| | | | |
|---|---|---|---|
| 9,758,856 | B2 | 9/2017 | Oberste Berghaus et al. |
| 2008/0217162 | A1 | 9/2008 | Delrue et al. |
| 2009/0159433 | A1 | 6/2009 | Neudecker et al. |
| 2009/0166187 | A1 | 7/2009 | Nagase et al. |
| 2012/0305392 | A1* | 12/2012 | Kim ........................ C23C 14/08 204/298.13 |
| 2015/0248997 | A1 | 9/2015 | Lo et al. |
| 2015/0368788 | A1 | 12/2015 | Oberste Berghaus et al. |
| 2017/0271134 | A1* | 9/2017 | Endo ........................ C04B 35/01 |

FOREIGN PATENT DOCUMENTS

| | | | |
|---|---|---|---|
| CN | 101903560 | A | 12/2010 |
| JP | 2006024413 | A * | 1/2006 |
| JP | 2008045213 | A * | 2/2008 |
| WO | 2007042394 | A1 | 4/2007 |
| WO | 2014122120 | A1 | 8/2014 |
| WO | 2016146732 | A1 | 9/2016 |

OTHER PUBLICATIONS

Kalai Vani et al., "Synthesis and Characterization of Electron Beam Evaporated LiCoO$_2$ Thin Films," Ionics, Aug. 7, 2007, vol. 13, No. 6, pp. 473-477.

Zhu et al., "LiCoO$_2$ Cathode Thin Film Fabricated by RF Sputtering for Lithium Ion Microbatteries," Surface & Coatings Technology, Nov. 10, 2009, vol. 204, No. 11, pp. 1710-1714.

International Search Report and Written Opinion from PCT Application No. PCT/EP2018/084379, dated Mar. 14, 2019.

Belgian Search Report from corresponding BE Application No. BE 2017/5957, dated Aug. 6, 2018.

Office Action from corresponding Chinese Application No. 201880074505.9, dated May 5, 2022.

Japanese Office Action in corresponding Japanese Patent Application No. 2020-531967, dated Nov. 18, 2022.

* cited by examiner

SPRAYED LITHIUM COBALT OXIDE TARGETS

FIELD OF THE INVENTION

The present invention relates to the field of lithium cobalt oxide sputtering targets. More specifically it relates to lithium cobalt oxide sputtering targets which can be sputtered even in direct current mode.

BACKGROUND OF THE INVENTION

Rechargeable thin film batteries (RTFBs) can be extremely thin (200 µm), rechargeable solid-state batteries with fast recharge and long life cycle. They can for example be applied in ultra-thin mobile phones with batteries in the screen. Other application are for example RTFBs in "Internet of Things" devices or in chip batteries.

A basic example of a RTFB is schematically illustrated in FIG. 1. It comprises a stack of a first electrode 11 at the cathode side, a cathode 12, a solid electrolyte 13, an anode 14, a second electrode 15 at the anode side.

Lithium cobaltide ($LiCoO_2$) may be used as a cathode material for these RTFBs. Thereby it is the cathode material that defines the battery voltage. Lithium cobaltide has the advantage that it allows a high capacity.

The anode 14 may be a Lithium metal anode for providing the Li-ions. It can also be Li compound, it can be a Li-ion anode such as a Li-oxide or nitride containing Li, it can be a carbon or graphite structure or even silicon acting like a spunge to absorb or release the Li, etc.

The electrolyte should be an electric isolator but has to have a good ion conductivity. In RTFBs the electrolyte between the anode and cathode is a solid material which has as advantage that and will not start leaking. The electrolyte may for example be LiPON (lithium phosphorus oxynitride) or sulfide glasses. LiPON has the advantage that it has a good $Li^+$ conductivity and that it is stable in contact with Li.

The Li-ions are the positive charge that move from the anode to cathode. When charging the ions move from the cathode to the anode, when discharging the ions move from the anode to the cathode. By making a stack of a plurality anode/electrolyte/cathode layers the energy of the RTFB can be increased.

As these batteries have a large surface and as the ions only need to be moved over a short distance they can be rapidly charged. For the same reason high current pulses can be generated using such batteries.

In these RTFBs the thicker the cathode, the more of that $LiCoO_2$ material there is, the higher the capacity of the obtained RTFB. Thicknesses of 3-10 µm $LiCoO_2$ may for example be desired. The stack of anode/electrolyte/cathode and contacting electrodes may for example have a thickness of 10 to 15 µm.

Deposition of such a $LiCoO_2$ cathode layer may be achieved by sputtering. Moreover relatively thick layers (e.g. 3-10 µm) need to be sputtered.

There is therefore a need for good targets comprising a composition of lithium cobalt oxide which can be used in a sputtering system.

SUMMARY OF THE INVENTION

It is an object of the present invention to provide good sputtering targets and methods for producing the same and sputtering processes for sputtering using these targets.

The above objective is accomplished by a method and device according to the present invention.

In a first aspect embodiments of the present invention relate to a sputtering target comprising a top coat, the top coat comprising a composition of lithium cobalt oxide $Li_yCo_zO_x$ wherein x is smaller than or equal to y+z, and wherein the lithium cobalt oxide has an X-Ray diffraction pattern with a peak P2 at 44°±0,2° 2-theta, wherein the X-Ray diffraction pattern is measured with an X-Ray diffractometer with $CuK_{\alpha 1}$ radiation.

It is an advantage of embodiments of the present invention that a lithium cobalt oxide target is achieved that is DC sputterable. The sputtering target is DC sputterable because the top coat comprises a composition of lithium cobalt oxide, wherein the lithium cobalt oxide has an X-Ray diffraction pattern with a peak P2 at 44°±0,2° 2-theta.

Even though at low temperature the resistivity of the target seems too high for DC sputtering, it is possible to use these targets for DC sputtering. This is possible because when a target according to embodiments of the present invention is used in a sputtering system it is possible to decrease the resistivity of this target by increasing the power on the target. Beyond a power threshold the sputtering becomes very efficient at high deposition rates per unit of power density.

It is an advantage of embodiments of the present invention that the lithium cobalt oxide has an X-Ray diffraction pattern with a peak P2 at 44°±0.2° 2-theta. The presence of this peak implies material properties of the top coat which make that the plasma can be ignited by applying a voltage of a few hundred volts (i.e. typical sputter voltages). The presence of the P2 peak has moreover as advantage that stable sputtering over a wide range of pressures and powers with low arcing is possible. The presence of the P2 peak moreover allows for high deposition rates—since this less stable form of $Li_yCo_zO_x$ is earlier removed by the argon bombardment.

It is an advantage of embodiments of the present invention that it is not required to add conductive elements, such as carbon black or organic binders or metal, to make the target DC sputterable.

Such a target may be achieved by thermal spraying of powder which comprises particles of lithium cobalt oxide on a backing substrate. As no sintering is applied the peak P2 at 44°±0.2°2-theta will be present in the X-Ray diffraction pattern of the lithium cobalt oxide in the top coat of the target.

In embodiments of the present invention the lithium cobalt oxide has an X-Ray diffraction pattern which moreover comprises a peak P1 at 38°±0.2° 2-theta, and a peak P3 at 64°±0.2° 2-theta. The presence of the three peaks in the XRD diffraction pattern is advantageous because it corresponds with a phase in the top coat which makes that the target is DC sputterable. During startup the voltage on such a target will increase sharply with increasing power level up to a point where the resistivity starts decreasing with further increasing power level making the target suitable for DC sputtering.

In embodiments of the present invention peak P2 is the peak of the highest intensity in the XRD pattern of the lithium cobalt oxide material.

In embodiments of the present invention the peak intensity of the peak P2 is minimum 10% of the peak with the highest intensity in the XRD pattern of the lithium cobalt oxide material, or even minimum 20%, or even minimum 50% of the peak with the highest intensity in the XRD pattern of the lithium cobalt oxide material.

By modifying the intensity of the peaks, the material properties of the top coat can be modified. It is thereby important that the intensity of the P2 peak is at least 10% of the peak with the highest intensity in the XRD pattern of the lithium cobalt oxide material such that the target remains DC sputterable. In embodiments of the present invention the composition of lithium cobalt oxide $Li_yCo_zO_x$ of the top coat comprises a Fd-3m cubic spinel phase.

The presence of the Fd-3m cubic spinel phase can be determined by the peaks P1, P2, and P3. The presence of the cubic spinel phase is also advantageous as it enables DC sputtering.

In embodiments of the present invention the composition of lithium cobalt oxide is suboxidic with oxide amounts (i.e. oxygen amounts) between 42.5 at % and 49.8 at % of said top coat.

In embodiments of the present invention x is smaller than y+z. In case y+z is approximately 2, x may for example vary between 1.7 and 1.99. It may for example be equal to 1.85. In embodiments of the present invention y and z may be approximately 1.

In embodiments of the present invention y and z are approximately equal. They may for example differ less than 20% from each other, or even less than 10%, or even less than 5%. In embodiments of the present invention y is equal to z or up to 20% larger than z.

In embodiments of the present invention the composition has a higher Li content than Co content. In embodiments of the present invention y may for example range between 1 and 1.2 when z is 1. Targets according to embodiments of the present invention may for example comprise between 6 and 8.5 wt % of Lithium.

It is an advantage of embodiments of the present invention that the presence of the cobalt-oxide phase in an eventual deposited film, after sputtering using a target in accordance with embodiments of the present invention, can be reduced by having an increased amount of Li in the target.

In embodiments of the present invention the material of said top coat has a resistivity between 20 kΩ·cm and 200 kΩ·cm at room temperature.

In embodiments of the present invention said resistivity is measured by a four points probe resistivity measuring device having two outer probes, on a one piece top coat of said material having a thickness of at least two times the outer probes distance of said device. This thickness requirement is not a requirement of the sputtering target itself. Rather, it is a requirement of the measurement method since a four point probe resistivity measurement on a thinner top coat may lead to inaccurate measurements.

Although the resistivity at room temperature does not seem to be ideal for DC sputtering, it is possible to ignite the plasma by applying a DC voltage at a level of typical sputtering voltages and then after ignition further increase the power beyond a threshold after which the voltage decreases with increasing power to allow high deposition rates per unit power density at high powers. This current voltage behavior is caused by decreased target resistivity with increasing power and/or increasing target temperature.

In embodiments of the present invention the top coat is a one piece top coat.

It is an advantage of embodiments of the present invention that long cobalt oxide targets can be produced in one piece. For instance, one-piece lithium cobalt oxide targets can be produced having a length of more than 50 cm, or even more than 65 cm, or even more that 80 cm, or even more than 100 cm, or even more than 400 cm.

Having a one piece top coat, i.e. a top coat not consisting of 2 or more pieces (e.g. sleeves or tiles) attached together, is advantageous as it eliminates the preferential sputtering usually observed at the frontier between top coat pieces. Such sputtering originating from the edges of the pieces leads to the formation of heterogeneous bands in the sputtered layer. A one piece top coat therefore permits a homogeneous sputtered layer. Furthermore, at these interfaces between two adjacent pieces excess arcing may occur leading to an impact on layer quality and performance. Top coats with a length up to 4 meter of even higher may be achieved.

In embodiments of the present invention the sputtering target has a cylindrical shape.

In embodiments, the sputtering target may have any shape recognized as useful in the prior art. However, a cylindrical shape is preferred because it is rotatable without creating inhomogeneities in the sputtered film, and thereby allows a high uptime due to large material depot and high target utilization as well as very low production of particles, combined with increased process stability, compared to planar sputtering sources.

In embodiments of the present invention the sputtering target further comprises a backing substrate and a bond coat bonding said backing substrate with said top coat.

In embodiments of the present invention the backing substrate may be a metal substrate such as a metal tube. In embodiments of the present invention the bond coat may be a metal alloy having a melting temperature higher than 200° C., preferably higher than 300° C. and more preferably higher than 400° C.

In embodiments, said alloy may be a Ni alloy. Such a bond coat is advantageous as it reduces the risk of bond material related failures during sputtering. It also permits the use of higher power densities without melting the bond material. Higher power densities permits higher sputter rates.

In embodiments of the present invention the backing substrate is a backing tube.

In a second aspect embodiments of the present invention relate to a process for forming a coating on a substrate by sputtering wherein use is made of a sputtering target in accordance with embodiments of the present invention.

In embodiments of the present invention said sputtering is a DC sputtering, pulsed DC sputtering or an AC sputtering at a frequency below 350 kHz.

In embodiments of the present invention said sputtering is performed at a power density of at least 6 kW average DC power per meter target length.

In embodiments of the present invention, said sputtering may be performed at a power density of at least 6 kW, preferably at least 10 kW, more preferably at least 14 kW and most preferably at least 18 kW average DC power per meter target length up to 35 kW/m.

It is a clear advantage of the present invention that such a high power density can be used. For AC sputtering, the AC power density may be selected to be equivalent with the above mentioned DC values. The latter can e.g. be determined taking into account that twice the (integrated) power level applied to a dual configuration should correspond with the average DC power density per single target.

In a third aspect embodiments of the present invention relate to a method for manufacturing a sputtering target, said method comprising the steps of:

providing a powder which comprises particles of lithium cobalt oxide, $Li_yCo_zO_x$, wherein x is smaller than or equal to y+z, providing a backing substrate, projecting, preferably thermal spraying, said powder in a molten form onto said backing substrate, thereby cooling and solidifying said powder onto said backing substrate.

The powder may for example be molten by bringing it to a temperature between 1100° C. and 1300° C.

It is an advantage of embodiments of the present invention that targets comprising a composition of lithium cobalt oxide can be produced by a relatively simple and inexpensive method, namely thermal spray.

It is moreover advantageous that using this method it is possible to produce targets which are comprising a lithium cobalt oxide composition wherein the lithium cobalt oxide has an X-Ray diffraction pattern with a peak P2 at 44°±0.2° 2-theta. By thermal spraying sputtering targets can be obtained of which the composition has a Fd-3m cubic spinel phase.

To the best of the inventors' knowledge, other methods known from the prior art such as sintering, do not permit to obtain sputtering targets according to the first aspect. In particular, the top coat will not have a lithium cobalt oxide composition wherein the composition has a Fd-3m cubic spinel phase. On the contrary, by sintering the lithium cobalt oxide composition will change into a R-3m phase.

It is an advantage of embodiments of the present invention that the projection of the powder in molten form is directly done onto a backing substrate. This allows to form a one-piece top coat.

In embodiments of the present invention the backing substrate (e.g. the backing tube) of the sputtering target substrate may be roughened (e.g. via sand blasting) in order to increase the backing substrate interface with the bond coat or directly with the top coat. This has the advantage to improve thermal and electrical conductivity.

In methods according to embodiments of the present invention the backing substrate is a backing tube.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
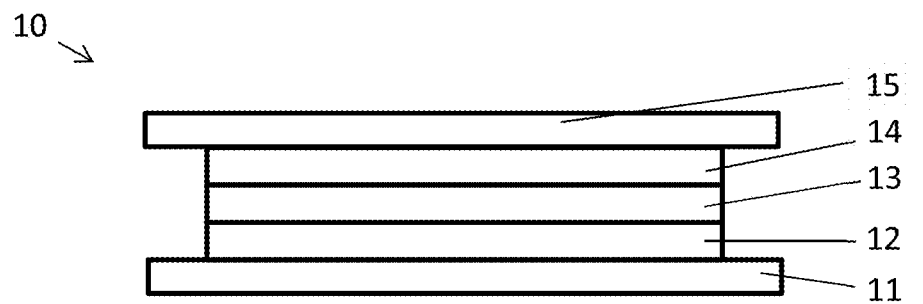
FIG. 1 shows a schematic drawing of a prior art RTFB.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to a composition of lithium cobalt oxide, reference is made to a composition comprising $Li_yCo_zO_x$ wherein x is smaller than or equal to y+z. In the chemical formula y and z may for example be substantially equal to 1 and x may in that case be smaller or equal to two.

Where in embodiments of the present invention reference is made to a high temperature phase, reference is made to $Li_yCo_zO_x$ in a R-3m crystal structure phase. This is a rombohedral phase.

Where in embodiments of the present invention reference is made to a low temperature phase, reference is made to $Li_yCo_zO_x$ in an Fd-3m structure.

In a first aspect embodiments of the present invention relate to a sputtering target 100 comprising a top coat 103. The top coat 103 comprises a composition of lithium cobalt oxide $Li_yCo_zO_x$ wherein x is smaller than or equal to y+z, and wherein the lithium cobalt oxide has an X-Ray diffraction pattern with a peak P2 at 44°±0.2° 2-theta wherein the X-Ray diffraction pattern is measured with an X-Ray diffractometer with $CuK_{\alpha1}$ radiation. The wavelength of CuKα1 is thereby known as λ=1.540562 Å.

Figure 2:
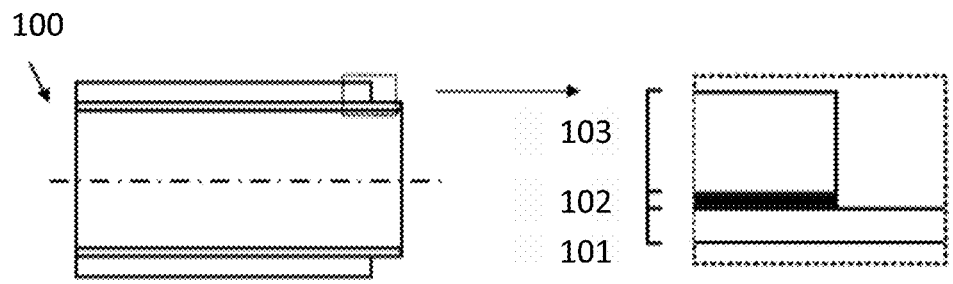
FIG. 2 shows a schematic drawing of a target in accordance with embodiments of the present invention.

In this composition y and z may be approximately equal to 1 or even equal to 1. This composition may be suboxidic with oxide amounts between 42.5 at % and 49.8 at % of said top coat. A schematic drawing of such a target is illustrated in FIG. 2. The left drawing is a schematic representation of a cross-section of a sputtering target tube in accordance with embodiments of the present invention. The right drawing shows an enlarged cross-section of the tube material.

The concentration of lithium cobalt oxide in the top coat is so high that the peak P2 of its X-Ray diffraction pattern is present in the eventual X-Ray diffraction pattern of the top coat. In embodiments of the present invention the concentration of lithium cobalt oxide in the top coat may for example be more than 50%, more than 70%, or even more than 80%, or even more than 90%, or even more than 99%, or even 100%. Possible dopant materials in the $Li_yCo_zO_x$ may for example be $LiCoMnO_x$ (Mn doping), $Li(Ni_{(1-y)}Co_y)O_x$ (Ni doping), $LiMn_xO_y$, $V_2O_x$, $LiMn_{1.5}Ni_{0.5}O_x$, etc.

A problem with $Li_yCo_zO_x$ for use as a target material is that it maybe electrically insulating. The disadvantage of electrically insulating targets is that it is not possible to sputter at DC or medium frequency AC but that sputtering at RF is required. In prior art lithium cobaltide sputtering targets this problem of high resistivity is solved by incorporating one or more conductive materials into the composition at a predetermined amount. Such a target is for example disclosed in US 2015/0248997.

$Li_yCo_zO_x$ targets according to embodiments of the present invention have the advantage that they are sputterable in DC or in medium frequency AC, being a frequency below 350 kHz, for example, 50 kHz. Therefore, during operation, such a target has to be conductive. This is achieved by providing a sputtering target 100 comprising a top coat 103 wherein the top coat 103 comprises a composition of lithium cobalt oxide $Li_yCo_zO_x$ wherein x is smaller than or equal to y+z, and wherein the lithium cobalt oxide has an X-Ray diffraction pattern with a peak P2 at 44°±0.2° 2-theta.

In embodiments of the present invention the lithium cobalt oxide has an X-Ray diffraction pattern which moreover comprises a peak P1 at 38°±0.2° 2-theta, and a peak P3 at 64°±0.2° 2-theta. The peak P2 may be the highest peak or it may be minimum 10% of the peak with the highest intensity in the XRD pattern of the lithium cobalt oxide material, or even minimum 20%, or even minimum 50% of the peak with the highest intensity in the XRD pattern of the lithium cobalt oxide material. By adjusting the process parameters of the thermal spraying (e.g. temperature, the concentration of the different elements in the lithium cobalt oxide composition), the peaks P1, P2, and P3 can be tuned. In embodiments of the present invention the composition of the top coat comprises a Fd-3m cubic spinel phase.

Figure 3:
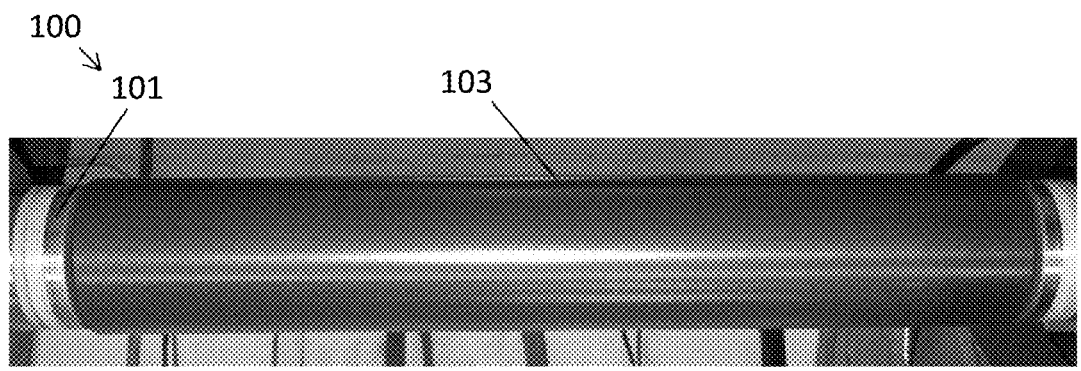
FIG. 3 shows a picture of a cylindrical $LiCoO_x$ target in accordance with embodiments of the present invention.

FIG. 3 shows a picture of a cylindrical $LiCoO_x$ target in accordance with embodiments of the present invention. The figure shows the top coat 103 on the backing substrate 101. The material composition of this exemplary target is as shown in the tables below. The target material is $LiCoO_x$. The x value is 1.96. The density is 3.78 g/cm³. The test method is ICP (Inductivly coupled plasma spectroscopy). The obtained composition, with all other metal impurities less than 0.1%, is:

| Material | wt % | Material | wt % |
|---|---|---|---|
| Li | 7.7 | Ca | 0.0068 |
| Co | 61.4 | Fe | <0.0002 |
|  |  | Cu | 0.0048 |
|  |  | Zn | 0.0027 |
|  |  | Mn | 0.0024 |
|  |  | Ni | 0.0340 |
|  |  | Al | 0.0120 |

Figure 4:
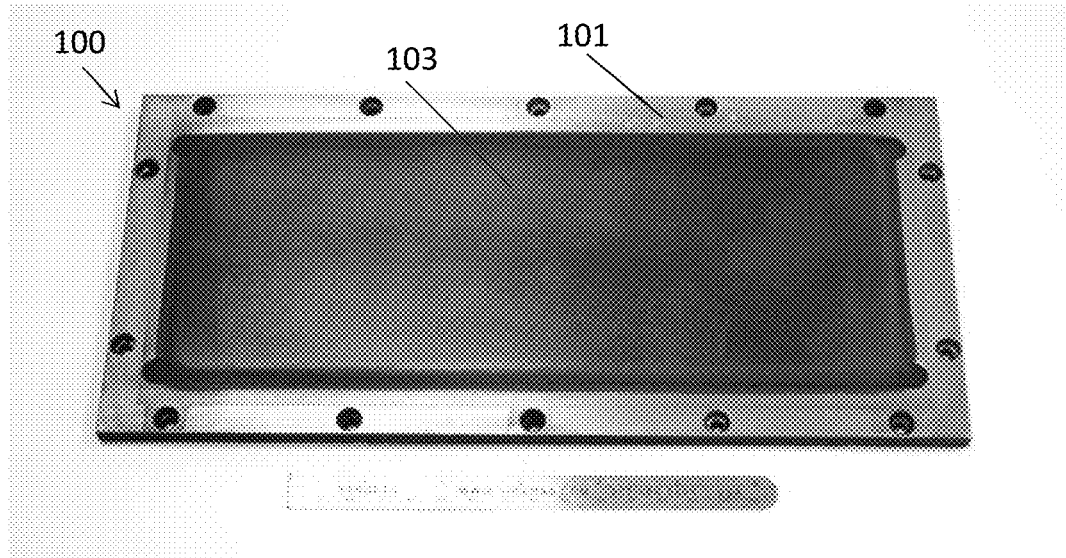
FIG. 4 shows a picture of a planar $LiCoO_x$ target in accordance with embodiments of the present invention.

FIG. 4 shows a picture of a planar $LiCoO_x$ (with x smaller than 2) target in accordance with embodiments of the present invention. The target is achieved using thermal spraying on a copper backing substrate 101. The top coat 103 in this figure has a thickness of 2.7 mm. The backing substrate 101, in this exemplary embodiment of the present invention has an area of 250×100 mm.

It is an advantage of embodiments of the present invention that the lithium cobalt oxide has an X-Ray diffraction pattern with a peak P2 at 44°±0.2° 2-theta, because this makes the target sputterable (the composition may for example contain a Fd-3m cubic spinel phase). It is moreover advantageous if the composition is suboxidic (e.g. comprising $LiCoO_x$ with x smaller than 2).

This is explained further when also explaining the second aspect of the present invention. This second aspect relates to a process for forming a coating on a substrate by sputtering wherein use is made of a sputtering target according to embodiments of the present invention.

Figure 5:
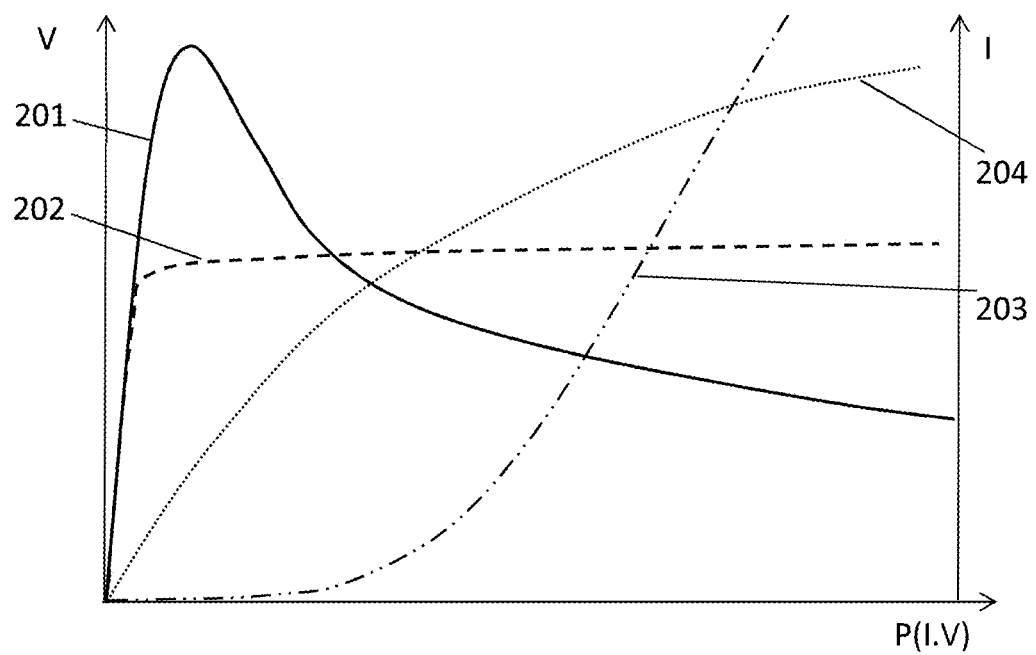
FIG. 5 shows the sputter voltage and the sputter current in function of the applied power for a prior art target and for a target in accordance with embodiments of the present invention.

FIG. 5 shows the sputter voltage 202 and the sputter current 204 in function of the applied power for a prior art target which is conducting at room temperature (e.g. with a resistivity below 1000 Ω·cm). FIG. 5 also shows the sputter voltage 201 and the sputter current 203 in function of the applied power for a target in accordance with embodiments of the present invention.

For a prior art conducting target it can be seen that when the power increases, the voltage 202 increases. In a first stage the voltage 202 increases rapidly, whereas in a second stage the voltage 202 slightly increases. As can be seen in this figure the slope of the current 204 is the highest in the first stage and is smaller in the second stage.

For the $Li_yCo_zO_x$ target in accordance with embodiments of the present invention it can be seen that in a first stage when the power increases the voltage 201 increases to a much higher level than for the prior art conducting target. Having a limited power, this implies that the current 203 is not that high. When increasing the power even more the voltage reaches a maximum, after which it starts decreasing with increasing power. The current remains low at the first stage and then eventually increases.

FIG. 5 shows that a $Li_yCo_zO_x$ target, in accordance with embodiments of the present invention, has a conductivity which is relatively small at the first stage (when the voltage is increasing with an increasing power) but increases after the voltage has reached a maximum.

To be DC sputterable, targets need to have a minimum conductivity. Targets in the MΩ·cm range are not sputterable by applying a DC voltage on the target. Targets in the range of 1000-3000 Ω·cm or lower on the other hand are DC sputterable. Prior art $Li_yCo_zO_x$ targets are designed to have a resistivity below a 1000 Ω·cm at room temperature. $Li_yCo_zO_x$ targets according to embodiments of the present invention, however, may have a resistivity at room temperature above 10 kΩ·cm. These high resistivity's may hint in the direction that these targets are not DC sputterable. However, by applying power to the target it was surprisingly found that the plasma easily ignites. By applying more power in a startup phase (the first stage) the voltage increases sharply. In this startup phase only low deposition rates could be achieved. With further increasing power level, the resistivity of the target starts decreasing making the target suitable for DC sputtering and stable operation was attained at a high deposition rate.

Without being bound by theory different causes for this change of the resistivity may be identified which mainly are related to the P2 peak in the X-ray diffraction pattern which indicates the presence of a Fd-3m cubic spinel phase in targets according to embodiments of the present invention and which is less stable than the rombohedral phase which is dominant in prior art $LiCoO_2$ target. The change in resistivity moreover is enhanced in a target wherein the composition is a suboxidic composition.

It was surprisingly found that top coats which show an X-Ray diffraction pattern with a peak P2 at 44°±0.2° 2-theta could be ignited in DC sputtering and could be sputtered at power densities up to 10 kW/m, or even up to 20 or even up to 40 kW/m length wherein the length is the length of a cylindrical target having an outer diameter between 135 and 170 mm.

It is assumed that this is possible because the Fd-3m phase is the least stable phase and therefore it is easier to render it conductive in the sputter process. This may be achieved by heating it, by ion bombardment or by applying a voltage. A suboxidic composition moreover lacks oxygen resulting in oxygen vacancies, which may lead to free charge carries and conductivity as well.

Figure 6:
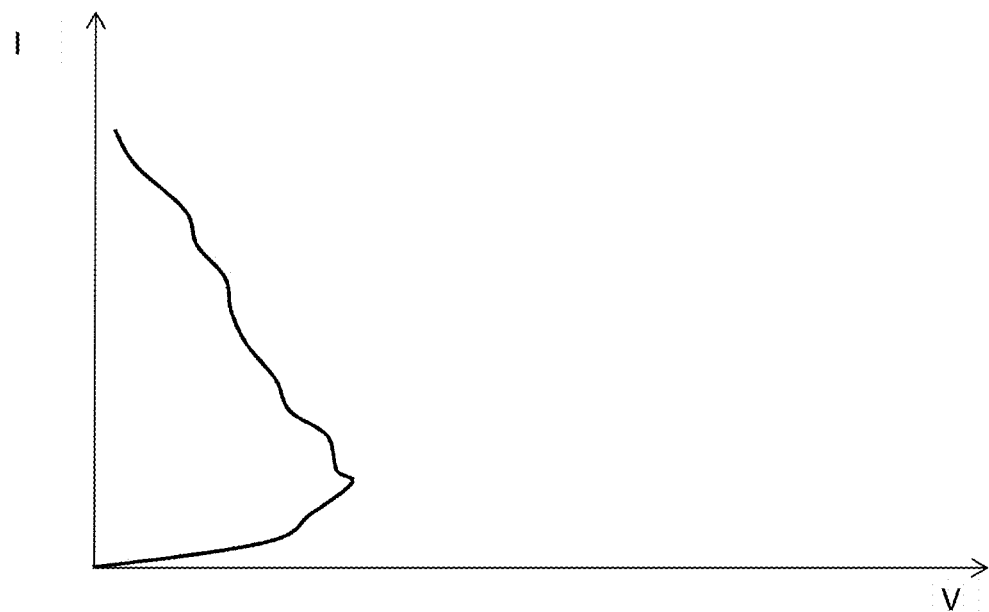
FIG. 6 showing the current in function of the applied voltage when sputtering using a target in accordance with embodiments of the present invention.

Once a plasma is achieved on the target it heats the target. This results in an increased conductivity of the target. This is also illustrated in FIG. 6 showing the current in function of the applied voltage. In the first stage the voltage is increasing up to a voltage of 550 V. In this region the target is not suitable to deposit $Li_yCo_zO_x$ at the most efficient rate per unit power density. Once running a current at that voltage, the target starts heating resulting in an increased conductivity. From that point onwards the voltage drops down and more current goes through the target. For FIG. 6 a system ramp-up with 1 kW per 15 min at 0.2 Pa (pure Ar) was applied.

Prior art sputterable targets, on the contrary, have a low resistivity without having to pass the first stage wherein a high voltage is applied separate from the plasma ignition. Prior art sputterable targets already have a low resistivity (e.g. 200 Ω·cm) at room temperature. In order to achieve this low resistivity, however, conductive materials may have been added to these targets. These additional conductive materials may be deposited when sputtering thereby negatively influencing the composition of the $LiCoO_2$ coating.

Prior art sputterable targets are often made by sintering and bonding. This has the disadvantage that high power densities cannot be applied because of bonding material limitations. Therefore higher deposition rates cannot be accessed. When applying dc power, it was surprisingly found that a plasma on the target in accordance with embodiments of the present invention easily ignites. At a power threshold, the voltage starts decreasing into a region that is suitable to deposit films at a high rate. In embodiments of the present invention the resistivity of the target may decrease with increasing temperature. In embodiments of the present invention, only when the power is increased until the voltage reaches a maximum the resistivity of the target starts to drop and the current increases, leading to high deposition rates per unit power and stable sputtering.

In embodiments of the present invention the oxygen stoichiometry x (in $Li_yCo_zO_x$) in the target may for example vary between 1.4 and 2, for example between 1.7 and 1.99, it may for example be 1.85 (y and z are in this case assumed to be approximately one or even equal to one). It is an advantage of embodiments of the present invention that by providing a suboxidic target the target can reach more easily a conductive state (e.g. putting 400 V on the target).

In a third aspect embodiments of the present invention relate to a method for manufacturing a sputtering target.

The method comprises the steps of:

providing powder which comprises particles of lithium cobalt oxide $Li_yCo_zO_x$, wherein x is smaller than or equal to y+z, providing a backing substrate, projecting, preferably thermal spraying, said powder in a molten form onto said backing substrate, thereby cooling and solidifying said powder onto said backing substrate.

The concentration of lithium cobalt oxide in the resulting top coat is thereby so high that the peak P2 of the X-Ray diffraction pattern of the projected $Li_yCo_zO_x$ is also present in the X-Ray diffraction pattern of the top coat. In embodiments of the present invention the concentration of lithium cobalt oxide in the top coat may for example be more than 50%, more than 70%, or even more than 80%, or even more than 90%, or even more than 99%, or even 100%.

Lithium cobalt oxide powders may for example be obtained by solid-state synthesis route involving the decomposition and intercalation of hydroxide precursors generated by precipitation and freeze-drying. They are commercially available. They may for example be obtained from Linyi Gelon New Battery Materials Co., Ltd in China.

In the example of FIG. 2 the sputtering target substrate may be composed of a backing substrate 101 and a high melting point Ni alloy bond coat 102. In FIG. 2 the backing substrate 101 is a backing tube. The backing tube 101 may have a relatively high roughness (this may for example be achieved by sand blasting) and the bond coat 102 may have a thickness of a few hundred μm. The thermal spray process consisted in accelerating and projecting (in the present case thermal spraying) droplets of at least partially molten lithium cobalt oxide material onto the sputtering target substrate, where they flatten upon impact and solidify to form a coating. The feedstock powder particles are typically in the size range from 10 to 90 microns and flow freely, which allows these powders to be fed consistently into the spray apparatus while being carried by a gas, typically argon, through the feeding hoses and injectors to the apparatus. In these examples a plasma spray system was used.

When thermal spraying, the particles are accelerated and molten. Because of the thermal spraying the composition of the top coat of the resulting target has an X-Ray diffraction pattern with a peak P2 at 44°±0.2° 2-theta. Moreover during thermal spraying oxygen may be lost while heating. If this oxygen is not regained this results in a suboxidic lithium cobalt oxide composition.

Figure 7:
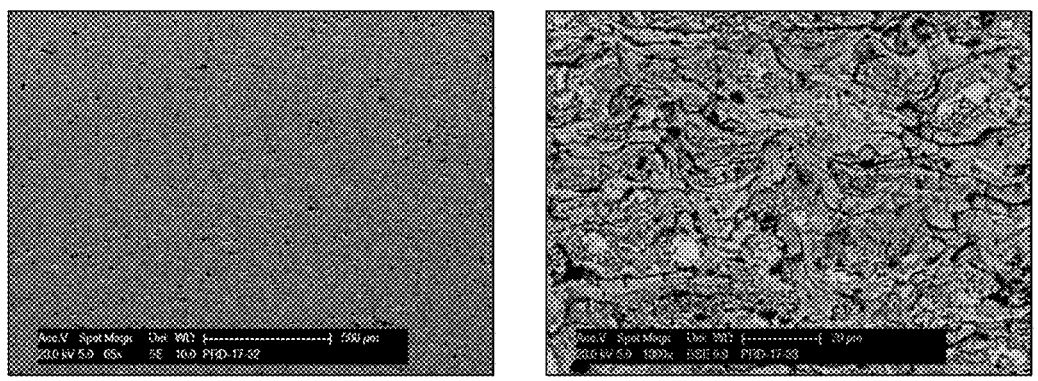
FIG. 7 shows the cross-section microstructure of a $Li_y$-$Co_zO_x$ thermal sprayed sample in accordance with embodiments of the present invention.

FIG. 7 shows a cross section microstructure of a $Li_yCo_zO_x$ thermal sprayed sample. The left picture shows a microscopic image wherein the indicated scale is 500 μm. The bottom right picture shows a microscopic image wherein the indicated scale is 20 μm. It shows images of molten powder which is afterwards solidified. This is different from a target which is obtained after a sintering process wherein the material is packed and by solid state diffusion sinters together. In this example the target has a density of 3.78 g/cm$^3$, a porosity of 10.7%, an x-value 1.96, a Li content of 7.7 wt %, and a Co content of 61.6 wt %.

In embodiments of the present invention the provided powder may be Li enriched. Thus Li enriched targets may be achieved.

Figure 8:
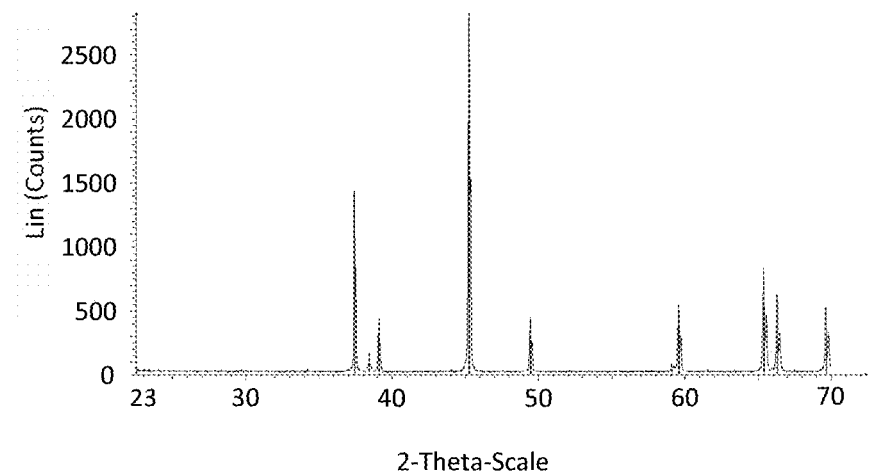
FIG. 8 shows an X-ray diffraction (XRD) graph of the powder comprising particles of $LiCoO_x$ that may be used to form a target in accordance with embodiments of the present invention.

FIG. 8 shows an X-ray diffraction (XRD) graph of a powder which is used for manufacturing a sputtering target by thermal spraying the powder in molten form on a backing substrate in accordance with embodiments of the present invention. From the peaks in the graph it can be concluded that the particles have the rhombohedral R-3m (high-temperature) LiCoO2. With an X-Ray diffractometer in in 2-theta range from 20° to 90° with $CuK_{\alpha 1}$ radiation, the most important peaks for the rhombohedral R-3m phase are 37.4°±0.3°, 39.1°±0.3°, 45.2°±0.3°, 49.5°±0.3°, 59.5°±0.3°, 65.4°±0.3°, 66.3°±0.3°, 67.8°±0.3°.

Figure 9:
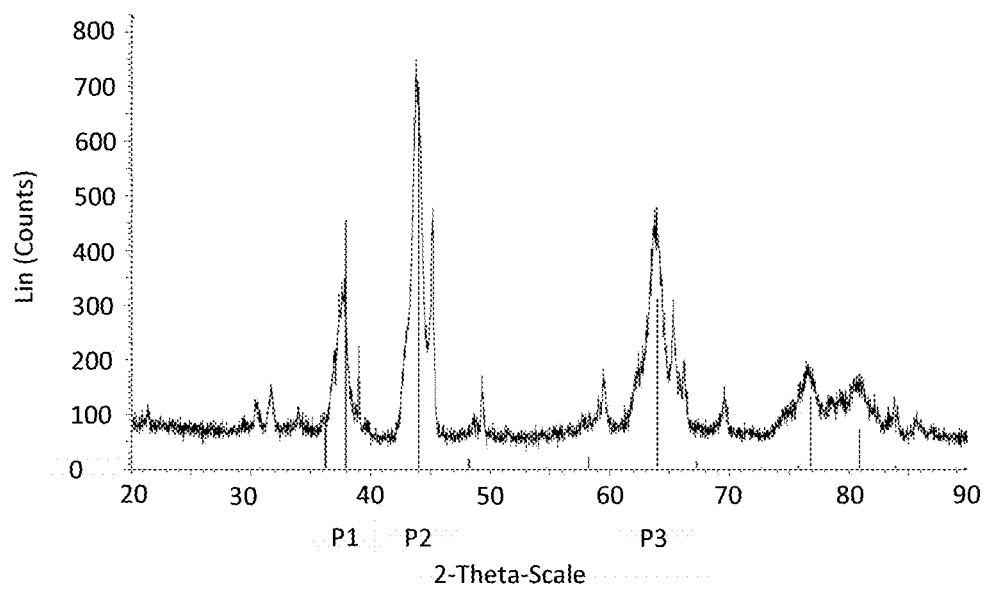
FIG. 9 shows an XRD graph of a target according to embodiments of the present invention.

FIG. 9 shows an XRD graph of a target according to embodiments of the present invention, obtained by thermal spraying the powder of which the XRD graph is shown in FIG.8. From the graph it can be seen that the targets comprise high amounts of Fd-3m cubic spinel-(low temperature) $LiCoO_2$. The most important peaks for the Fd-3m cubic spinel phase are P1 at 38°±0.2°, P2 at 44°±0.2°, P3 at 64°±0.2°, 76.9°±0.2°, 79.9°±0.2°.

Figure 10:
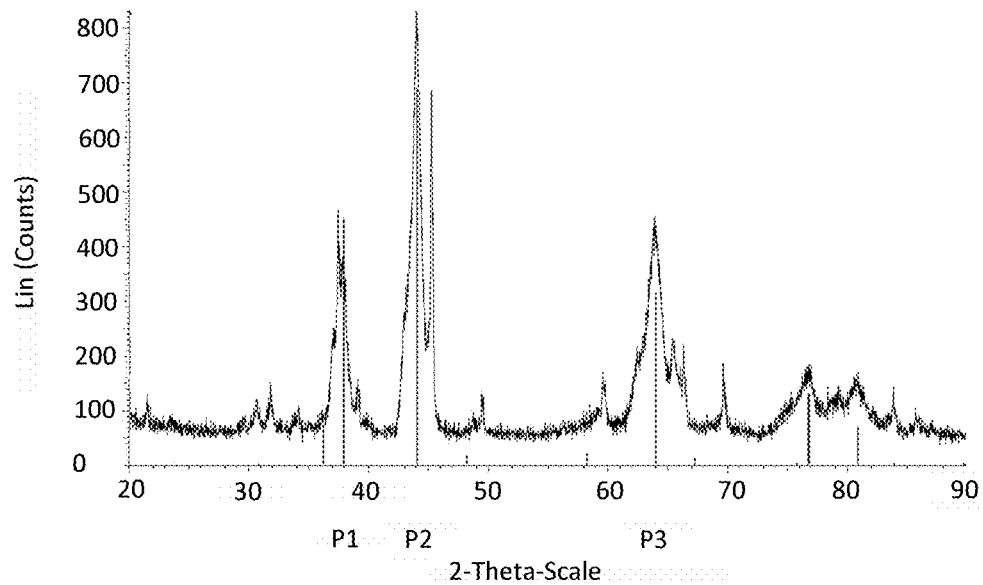
FIG. 10 shows an XRD graph of a target according to embodiments of the present invention; the target is another target than the target in FIG. 9.

FIG. 10 shows an XRD graph of a target according to embodiments of the present invention. The target is another target than the target in FIG. 9. In both graphs the P2 peak has the highest intensity. A variation in the peaks can be noticed between both graphs. Other combinations of peaks are possible. It is important that the peak P2 is present. In specific embodiments of the present invention the peaks P1, P2, and P3 are present. This indicates the presence of the cubic spinel phase.

Targets according to embodiments of the present invention may have a top coating which has more than 10%, even more than 20%, even more than 50%, even more than 60% of the Fd-3m cubic spinel phase. This can for example be determined from the relative area of the diffraction peaks of the XRD of the top coating.

Figure 11:
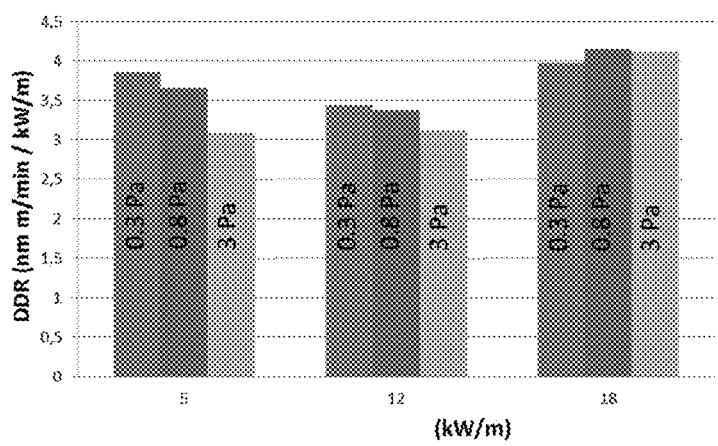
FIG. 11 shows the dynamic deposition rate in function of the sputter power when sputtering a target in accordance with embodiments of the present invention.

FIG. 11 shows the dynamic deposition rate in function of the sputter power when sputtering a target in accordance with embodiments of the present invention and this for different pressures at each power level (from left to right 0.3 Pa, 0.8 Pa, 3 Pa). For this graph 0% oxygen was added. From this graph it can be seen that it is an advantage that high deposition rates can be obtained using a target in accordance with embodiments of the present invention. This graph also illustrates that when the power is doubled, also the sputter rate at least doubles. This graph also illustrates that the highest deposition rates per unit power are obtained at the highest power.

In this example deposition rates per unit power density of up to about 4 nm m/min/kW/m can be obtained at a power density of 18 kW/m. The first nm thereby refers to the thickness, the m/min refers to the transport speed of the substrate and the kW/m refers to the power per target length. As can been seen from this figure the deposition rate per unit power density is even increasing with increasing power densities.

Without being bound by theory the reason therefore may be found in the presence of the peak P2 at 44°±0.2° 2-theta in the X-Ray diffraction pattern of the lithium cobalt oxide. As a result thereof the material properties of the top coating of the target are such that the resistivity decreases with an increasing temperature. This as opposed to prior art sputtering targets wherein the resistivity is not significantly affected by temperature, at least not to the degree at which it is noticeable in sputtering.

Figure 12:
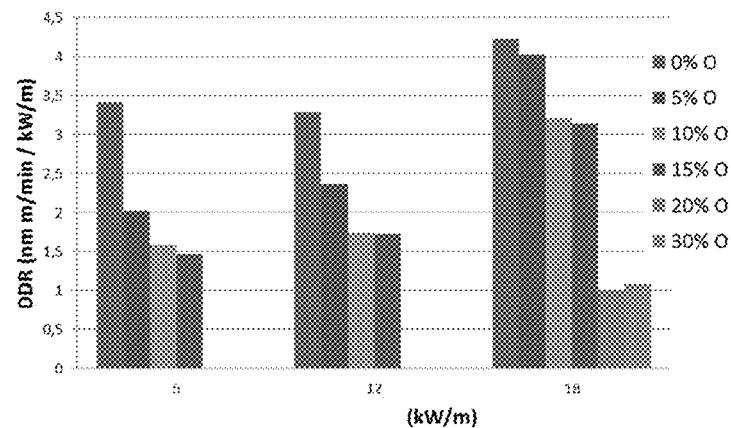
FIG. 12 shows the effect of adding oxygen to the sputtering process on the dynamic deposition rate.

FIG. 12 shows that by adding oxygen to the sputtering process the deposition rate goes down. The applied sputter power was respectively 5, 12, and 18 kW/m. At each power level the dynamic deposition rate is shown for different partial pressures of oxygen (from left to right 0%, 5%, 10%, 15%, 20%, 30%). The pressure was 0.8 Pa. Oxygen is added to the sputtering process in order to achieve a certain stoichiometry in the deposited film. Also in this example deposition rates per unit power density of up to about 4 nm m/min/kW/m can be obtained at a power density of 18 kW/m.

It is an advantage of sputtering targets in accordance with embodiments of the present invention that power levels up to 21 kW/m and even up to 30 kW/m and even up to 40 kW/m can be obtained and hence also a high deposition rate can be obtained. This is also shown in FIG. 11 and FIG. 12 showing that an advantageously high deposition rate at a high power can be obtained using a sputtering target in accordance with embodiments of the present invention. This high power can be achieved by such a thermal sprayed target because of the lack of bonding. Even though sputtering targets according to embodiments of the present invention may be not conducting at room temperature they have the advantage of high deposition rates at high powers because their top coat composition comprises a Fd-3m cubic spinel phase.

If the target is made of $LiCoO_2$ it may be preferential to add oxygen during the sputtering process because oxygen gets lost during the sputtering process. Also if the target is suboxidic it may be preferential to add oxygen during the sputtering process.

During the sputtering process high powers may be preferred in order to realize a thick Lithium cobaltide coat. Powers up to 10 kW/m or even up to 20 kW/m may be applied. Pressures up to 1 Pa or even up to 5 Pa may be applied in order to achieve a porous coat. A porous coating is advantageous because the higher the porosity the higher the surface area for storing the Li-ions.

A target in accordance with embodiments of the present invention may be used for sputtering a $LiCoO_2$ film. Thicknesses of for example 3 μm may be obtained. Oxygen may be added while sputtering to obtain a $LiCoO_2$ layer. The target may have a high Lithium content (e.g. Li/(Li+Co)>11 wt %)). The target may have a cylindrical shape (a tubular rotary target). The pressure during the sputtering process may be close to 1 Pa. The sputtering gas may be pure Argon. Additional oxygen gas may not be strictly necessary while depositing. A post annealing step may be applied on the film after it is deposited e.g. to 500° C. for several hours).

Figure 13:
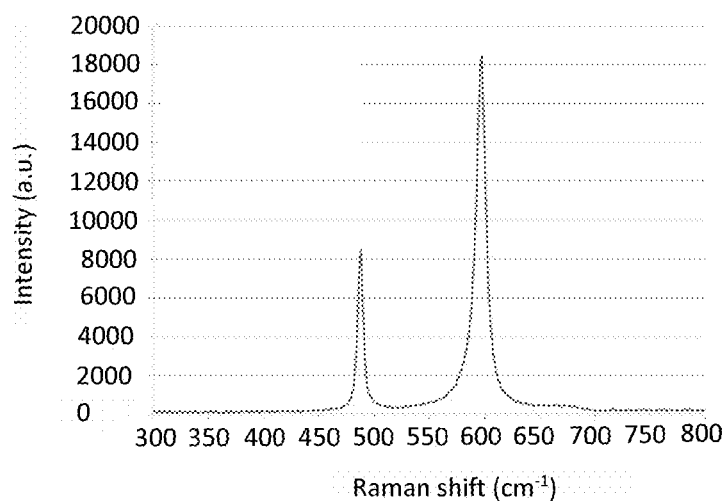
FIG. 13 shows the Raman spectrum of the sputtered $LiCoO_2$ film resulting from a sputtering target in accordance with embodiments of the present invention.

The presence of one or more of the different phases can be measured by a Raman spectrometer. FIG. 13 shows the Raman spectrum of the sputtered $LiCoO_2$ film. The film was obtained by DC-sputtering from a tubular sputtering target in accordance with embodiments of the present invention at a pressure of 0.8 Pa using pure Argon as sputtering gas. After sputtering a post heating step is applied on the film at 500° C. during 10 h. The Raman shift of the laser light thereby indicates the presence of one or more of the phases. Sharp peaks at 487 and 597 cm-1 for desired R-3m $LiCoO_2$ phase (the high temperature phase). Low Temperature —$LiCoO_2$ (Fd3m) at 450 cm-1 is not detected in the sputtered $LiCoO_2$ film.

Thin film battery devices comprising a substrate, a $LiCoO_2$ cathode film sputtered using a sputtering target in accordance with embodiments of the present invention, a LiPON electrolyte and a metal lithium anode yielded a capacity of approximately 1.7 mA/hr for a high number of charging/discharging cycles.

The invention claimed is:

1. A sputtering target comprising a top coat, the top coat comprising a composition of lithium cobalt oxide $Li_yCo_zO_x$ wherein x is smaller than or equal to y+z, and x is smaller than or equal to 2,
wherein the lithium cobalt oxide has an X-Ray diffraction pattern with a peak P2 at 44°±0.2° 2-theta, when the X-Ray diffraction pattern is measured with an X-Ray diffractometer with CuKα1 radiation, and
wherein the top coat comprises flattened droplets of $Li_yCo_zO_x$ obtained by melting powder of the $Li_yCo_zO_x$ and by projecting droplets of the at least partially molten lithium cobalt oxide material onto a backing substrate, where they flatten upon impact and solidify to form a coating.

2. The sputtering target according to claim 1, wherein the lithium cobalt oxide has an X-Ray diffraction pattern which moreover comprises a peak P1 at 38°±0.2° 2-theta, and a peak P3 at 64°±0.2° 2-theta.

3. The sputtering target according to claim 1, wherein the peak P2 is the peak of the highest intensity in the XRD pattern of the lithium cobalt oxide material.

4. The sputtering target according to claim 1, wherein the peak intensity of the peak P2 is minimum 10% of the peak with the highest intensity in the XRD pattern of the lithium cobalt oxide material.

5. The sputtering target according to claim 1, wherein the composition of lithium cobalt oxide $Li_yCo_zO_x$ of the top coat comprises a Fd-3m cubic spinel phase.

6. The sputtering target according to claim 1, wherein the composition of lithium cobalt oxide is suboxidic with oxygen amounts between 42.5 at % and 49.8 at % of said top coat.

7. The sputtering target according to claim 1, wherein y and z are approximately equal.

8. The sputtering target according to claim 1, wherein y is equal to z or up to 20% larger than z.

9. The sputtering target according to claim 1, wherein the material of said top coat has a resistivity between 20 kΩ·cm and 200 kΩ·cm at room temperature.

10. The sputtering target according to claim 1, wherein the top coat is a one piece top coat.

11. The sputtering target according to claim 1, wherein the sputtering target has a cylindrical shape.

12. A process for forming a coating on a substrate by sputtering wherein use is made of a sputtering target according to claim 1.

13. The process according to claim 12, wherein said sputtering is a DC sputtering, pulsed DC sputtering or an AC sputtering at a frequency below 350 kHz.

14. The process according to claim 13, wherein said sputtering is performed at a power density of at least 6 kW average DC power per meter target length.

15. A method for manufacturing a sputtering target, said method comprising the steps of:
providing a powder which comprises particles of lithium cobalt oxide $Li_yCo_zO_x$, wherein x is smaller than or equal to y+z, and wherein x is smaller than or equal to 2,
providing a backing substrate,
melting the powder and projecting droplets of the at least partially molten lithium cobalt oxide material onto said backing substrate, where they flatten upon impact and solidify to form a coating thus obtaining flattened droplets of $Li_yCo_zO_x$.

* * * * *